United States Patent [19]

Bourgeois et al.

[11] Patent Number: 4,516,525

[45] Date of Patent: May 14, 1985

[54] ELECTRON GUN EQUIPMENT FOR VACUUM DEPOSITION

[75] Inventors: Serge Bourgeois, Draveil; Jean-Franqois Carle, Saint Cheron; Henri Lochon, Corbeil Essonnes; Jean-Pierre Trotin, Milly-La-Foret, all of France

[73] Assignee: International Business Machines Corporation, Armonk, N.Y.

[21] Appl. No.: 544,027

[22] Filed: Oct. 21, 1983

[30] Foreign Application Priority Data

Oct. 28, 1982 [EP] European Pat. Off. ......... 82430032.1

[51] Int. Cl.$^3$ .............................................. C23C 13/12
[52] U.S. Cl. ..................... 118/688; 118/712; 118/720; 118/726; 118/730; 219/275; 219/121 EE
[58] Field of Search ............... 118/720, 726, 727, 730, 118/688, 689, 690, 721, 712; 427/42; 219/121 EF, 121 EG, 121 EE, 275

[56] References Cited

U.S. PATENT DOCUMENTS

| | | | |
|---|---|---|---|
| 3,235,647 | 2/1966 | Hanks | 13/31 |
| 3,277,865 | 10/1966 | Smith, Jr. | 118/720 |
| 3,316,386 | 4/1967 | Yaffe et al. | 118/726 X |
| 3,344,768 | 10/1967 | Jennings | 118/726 |
| 3,401,055 | 9/1968 | Langdon et al. | 117/212 |
| 3,437,734 | 4/1969 | Roman et al. | 13/31 |
| 3,446,934 | 5/1969 | Hanks | 219/121 |
| 3,458,925 | 8/1969 | Napier et al. | 29/578 |
| 3,560,252 | 2/1971 | Kennedy | 117/107 |
| 3,576,670 | 4/1971 | Hammond | 427/9 |
| 3,656,454 | 4/1972 | Schrader | 118/49 |
| 3,662,708 | 5/1972 | Shrader | 110/49 |
| 4,380,212 | 4/1983 | Kraus | 118/730 X |

FOREIGN PATENT DOCUMENTS

| | | | |
|---|---|---|---|
| 2628765 | 12/1977 | Fed. Rep. of Germany | 427/42 |
| 995180 | 5/1962 | United Kingdom | 118/726 |

OTHER PUBLICATIONS

IBM Technical Disclosure Bulletin, vol. 23, No. 2, Jul. 1980, "Off-Center E-Gun Deposition Source in Planetary Evaporation System", W. J. Curry et al., p. 565.
IBM TDB, vol. 14, No. 8, Jan. 1972, "Drive Mechanism for Rotating Dome in a Metal Evaporator", H. W. Mock et al., pp. 2382-2383.
IBM TDB, vol. 22, No. 2, Jul. 1979, "Low Charge Level AlCu MOS Deposition Process Using an E-Gun Source", K. Beermunder et al., pp. 556-557.
IBM TDB, vol. 23, No. 7B, Dec. 1980, "Plasma-Sprayed Evaporation Crucible", H. Seehase, p. 3281.
IBM TDB, vol. 20, No. 5, Oct. 1977, "Double Filament Electron-Beam Evaporation Source", G. P. Dahlke et al., pp. 1738-1739.
IBM TDB, vol. 18, No. 7, Dec. 1975, "Semiconductor Wafer Dome for an Evaporator", G. P. Dahlke et al., p. 2171.
IBM TDB, vol. 22, No. 12, May 1980, "Wafer Holder for Evaporation", C. G. Lennon, Jr., pp. 5354-5355.
IBM TDB, vol. 23, No. 11, Apr. 1981, "Evaporation Dome", by C. G. Lennon, Jr., p. 4913.
IBM TDB, vol. 22, No. 2, Jul. 1979, "High Capacity Metal Deposition Wafer Domes", by W. J. Curry et al., p. 555.
IBM TDB, vol. 24, No. 11B, Apr. 1982, "Thermally Controlled Rotating Master Dome", pp. 5995-5996.
IBM TDB, vol. 25, No. 12, May 1983, "Large Bell Jar for Evaporator to Increase Wafer Throughput", pp. 6591-6592.

(List continued on next page.)

*Primary Examiner*—John D. Smith
*Assistant Examiner*—Bernard F. Plantz
*Attorney, Agent, or Firm*—Henry Powers

[57] ABSTRACT

This invention relates more particularly to an electron-gun metal evaporation system for solder (lead/tin, lead/indium) deposition upon integrated circuit chips. This system utilizes a crucible comprised of a tantalum bent-cone V-shaped liner or cup seated in spaced relationship in a recess of a copper hearth.

8 Claims, 3 Drawing Figures

OTHER PUBLICATIONS

IBM TDB, vol. 19, No. 7, Dec. 1976, "Evaporation Shielding for Continuous Pb in Deposition", pp. 2496-2498.

IBM TDB, vol. 24, No. 7A, Dec. 1981, "Two-Cycle Pb/Sn Solder Evaporation", p. 3393.

IBM TDB, vol. 13, No. 7, Dec. 1970, "Crucible for Electrobeam Gun Evaporation", by H. H. Renken, p. 1919.

IBM TDB, vol. 11, No. 6, Nov. 1968, "Bilayer Electron Beam Evaporation Crucible", by H. C. Cook et al., p. 680.

IBM TDB, vol. 26, No. 2, Jul. 1983, "Enhanced E-Beam Evaporation of Tin", by V. C. Marcotte et al., p. 608-609.

IBM TDB, vol. 16, No. 4, Sep., "Crucible Liner for Electron Beam High-Evaporation Rate Source", by J. J. Dankelman et al, p. 1034.

IBM TDB, vol. 24, No. 1B, Jun. 1981, "E-Gun Source Thermal Stabilizer", by W. J. Slattery, p. 850.

IBM TDB, vol. 20, No. 4, Sep. 1977, "Electron-Beam Chrome Evaporator", by Q. J. Carbone et al., p. 1375.

IBM TDB, vol. 19, No. 7, Dec. 1976, "Evaporation Crucible", by K. Keller et al., p. 2590.

IBM TDB, vol. 24, No. 11B, Apr. 1982, "Crucible for Silicon and Titanium Evaporation", by H. Renken, p. 5902.

IBM TDB, vol. 20, No. 7, Dec. 1977, "Crucible for Aluminum Evaporation", by W. M. Morgan, p. 2844.

ELECTRON GUN EQUIPMENT FOR VACUUM DEPOSITION

FIELD OF THE INVENTION

This invention concerns electron gun apparatus for vacuum deposition of metal coatings on substrates and, more particularly, to such equipment for solder pad or ball (e.g. Pb-Sn, Pb-In) deposition upon silicon monolithic integrated circuit chips.

BACKGROUND OF THE INVENTION

As discussed in U.S. Pat. No. 3,458,925 and in the IBM-Technical Disclosure Bulletin (TDB) article "Double Mask System For Solder Bump Formation" by P. A. Totta pp. 2734-2735 Vol. 22, No. 7, December 1977 this solder pad deposition step is performed at substantially the final stages of silicon wafer processing, before the dicing of the wafers into chips. The silicon wafers which have been subject to the different processing steps (epitaxy, diffusion, oxidation, metallurgy, passivation, . . . ) are ready to receive the solder pads.

First, apertures or contact vias in accordance with a required configuration or pattern are formed into the upper isolating or passivating layers of the wafers and, then, the solder or ball limiting metallurgy, BLM, (generally, a disc-shaped chromium-copper-gold multilayer, see the aforesaid U.S. Pat. No. 3,458,925), is formed in and around these apertures or vias. The final step, therefore, comprises forming the solder pads, more typically, bumps or balls at the emplacements of these contact discs in order to be subsequently used as input/output contacts for the chips.

As noted above, a conventional process of forming such solder pads is disclosed in the aforesaid U.S. Pat. No. 3,458,925, and an improvement thereof is disclosed in the above noted IBM Technical Disclosure Bulletin, Article of P. A. Totta.

Such a process, heretofore, typically included the following steps:
  Masking the surface of the semiconductor wafer, generally by means of a metal mask, so as to expose the limiting areas comprised of the BLM discs as well as the area immediately adjacent to each of these discs for each chip;
  Vacuum-evaporating a thin layer of solder, through a mask, using a R.F. induction heated crucible, containing the solder, and removing the mask;
  Heating the wafer to the solder melting point so that said solder shrinks and its surface strain changes it for reflow into a bump or ball; and finally,
  Cooling the wafer so as to set the solder.

Such a conventional R.F. induction or heated crucible vacuum-evaporation process has two major drawbacks. In such a process, the bulk of the source contained in the heated crucible, is heated. This results in that:
  1. Coupling fluctuations between the induction coil and the crucible, are inevitable (because they are bound to various parameters some of which are difficult to control, such as, for instance, cooling temperature of water coil, variations in the source volume during evaporation, etc.). These fluctuations which are difficult to control have a strong influence upon the evaporation rates which are neither constant nor reproducible. As a consequent large discrepancies result in the characteristics of such R.F. evaporated films.
  2. Still more important is the formation of projections, the so-called spitting phenomenon, which randomly occurs during evaporation, thereby generating imperfect deposits. A possible explanation is that the evaporation is sometimes impeded by the formation of a membrane comprised of oxided compounds located at the surface of the melt until the pressure difference between the melt and the vacuum chamber becomes sufficient to break the membrane, which brings about an explosion which projects significant amounts of material in the direction of the wafers, and which often chokes completely or partially fills the holes in the metal mask. This results in either missing pads or pads not having the required size. In every respect, the chips having a single one of these imperfections, are discarded. As a rule, a few percentages of the manufacture are disclosed before the chips are arranged or mounted upon ceramic supporting modules. A solution to this problem is to lower the deposition rate, but with the obvious drawback of increasing the cycle time to such an extent that this solution cannot be envisaged from an industrial or economic point of view.

In addition, it is well known that recent microelectronic developments are based on an increasing miniaturization of the various elementary components whether they are active (transistors, diodes, . . . ) or passive (resistors, . . . ) thereby leading to a high scale integration.

Furthermore, an increasing number of logic and/or analog functions are intergrated upon a single chip.

As a result therefor, a considerable increase in the number of the solder pads is reduced for each chip in order to insure the exchange of the electrical signals between the chip and the off-chip circuits.

The medium scale integration chips (MSI) have had so far about twenty solder pads; the large scale integration chips have had about one hundred of them. With integration approaching one million circuit components, the very large scale integration is achieved (VLSI) with the resulting need for achieving chips having several hundred solder pads.

The conventional techniques for vacuum deposition of solder pads by R.F. induction, cannot meet this requirement since the sizes of the pads must be increasingly smaller, and it is mandatory to have a closer control of the parameters such as, for instance, composition and volume, for the pad definition. The above-mentioned spitting phenomenon would also cause a too large a number of imperfect pads and would, in connection with the required number of the plots, lead to discarding or scrapping an increasing and larger quantity of the chips, which cannot possibly be envisaged or tolerated economically.

SUMMARY OF THE INVENTION

Accordingly, this invention relates to solder pad deposition systems or apparatuses with the following purposes:
  1. Increasing the quality of the deposited films and giving reproducible results (thickness, composition), whatever be the material to be deposited (Pb, Sn, In . . . ), and this with consistency from batch to batch;

2. Increasing the throughput by reducing the number of the imperfect or missing solder pads;
3. Reducing the manufacturing cost owing to an improved yield capacity, with shorter cycle times and longer lifetimes for the crucibles;
4. Simplifying the vacuum-evaporation equipment.

These objects are attained by improving the vacuum-deposition equipment by means of an electron gun system, disclosed in detail herein.

Illustrative type of vacuum deposition equipment comprehended in this invention, are shown and described in U.S. Pat. No. 3,437,734, No. 3,446,934, No. 3,576,670, No. 3,656,454 and No. 3,662,708, and in the IBM-Technical Disclosure Bulletin (IBM-TDB) article "Double Filament Electron-Beam Evaporation Source" by G. P. Dahlke et al pp. 1738–1739, Vol. 20, No. 5, October 1977. In general, these systems include a vacuum chamber, a substrate carrier for typically silicon wafers, exposed according to a required configuration, a crucible containing the source of the material to be evaporated, and an electronic gun, with the foregoing modified in accordance with this invention, wherein the improvements are directed to:

a crucible which is comprised of a bent-cone V-shaped tantalum liner placed in a recess of a copper pot or hearth, and in spaced relationship therewith it, in order to limit the thermal exchanges or transfers between them. The liner contains the source of the material to be evaporated, such as: Pb-Sn or Pb-In solder. The electron beam is focused on to the center of the source. The substrate carrier is formed of a several tiered dome which is rotatively mobile and associated with a removable shield which is placed between the source and the substrates during lead evaporation and which is removed during tin evaporation. A ion collector gauge monitors the transition from lead to tin evaporation. Illustrative domes can be found described in the IBM-TDB article "Drive Mechanism For Rotating Dome In A Metal Evaporator" by H. W. Mock et al., pp. 2382–2383, Vol. 14, No. 8, January 1972; the IBM-TDB article "Semiconductor Wafer Dome For An Evaporator" by G. P. Dahlke et al., p. 2171, Vol. 18, No. 7, December 1975; the IBM-TDB article "Wafer Holder For Evaporation" by C. G. Lennon, Jr., pp. 5354–5355, Vol. 22, No. 12, May 1980; the IBM-TDB article "Evaporation Dome" by C. G. Lennon, Jr., p. 4913, Vol. 23, No. 11, April 1981; the IBM-TDB article "High Capacity Metal Deposition Wafer Domes" by W. J. Curry et al., p. 555, Vol. 22, No. 2, July 1979; and the IBM-TDB article "Thermally Controlled Rotating Master Dome" by J. F. Cosgrove et al., pp. 5995–5999, Vol. 24, No. 11B, April 1982.

BRIEF DESCRIPTION OF THE DRAWINGS

For a better understanding, this invention will be further disclosed and described with reference to the accompanying drawings which show a preferred embodiment of the invention.

DESCRIPTION OF THE PREFERRED EMBODIMENTS

Figure 1:
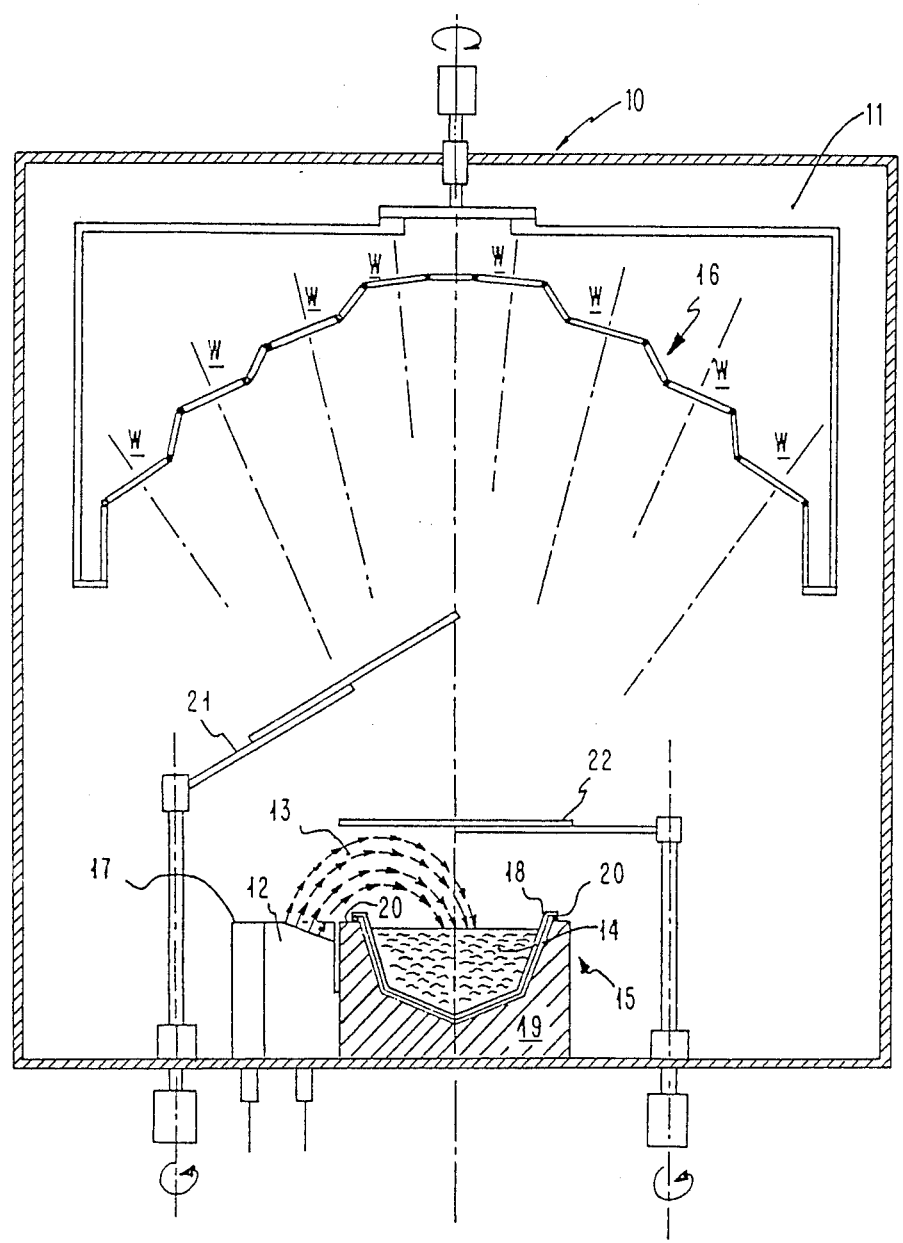
FIG. 1, is a schematic diagram of the electron gun equipment for vacuum-deposition of metallization on substrates in accordance with this invention.

FIG. 1 is a schematic view of an E-beam evaporator unit in accordance with this invention. The evaporator tool 10 comprises, fundamentally, some of the conventional components involved in an electron gun systems for vacuum deposition, namely, a vacuum chamber 11 mounted in a housing (not shown), such as Model A 100 Q manufactured by Leybold Heraeus. An electron gun 12 which generates and focuses an electron beam 13 on to the source or melt 14 to be evaporated, which is contained in a crucible 15. A substrate carrier 16 carries a determined number of silicon wafers exposed according to a desired configuration, metal masks (not shown) which have been noted above. It comprises also a ion collector gauge 17 being, for instance, of the LH 833215 type, usually involved in the monitoring of the evaporation rates.

The primary pumping/oil diffusion pumping assembly which functions to create vacuum in the chamber 11, has not been shown; nor have the various cooling means of the vacuum chamber, crucible, etc. been shown.

Normally, the electron beam impinges upon the source 14 on the edge of the crucible, which ensures a better thermal behavior of the crucible owing to the convection currents developed in the source. Also, the crucible has normally been a molybdenum container or cup slightly tilted in a copper pot by means of a wedge. Such conventional units have found use in metal alloy deposition such as, for instance, aluminum-copper, for conductor configurations (2 micron thick) on a semiconductor chip surfaces having bipolar devices. However, such units have not found acceptance for the depositions of solder pads of about 100 micron thick and having closely monitored compositions and volumes, or in unipolar device applications, such as field effect transistors.

There is another reason why the prior art electron gun systems have not heretofore found use for the deposition of solder pads, even though such techniques have been mastered and widely used, for metallization in various industries for the deposition of a large variety of materials, more specifically, metals or metal alloys. It is well-known that an electron beam generates deep X-rays and secondary electrons which irradiate the substrates during the deposition step. As far as integrated circuit chips are concerned, the metallurgy, which is generally formed of aluminum or aluminum-copper conductors which are isolated from one another and passivated by silicon dioxide layers, the presence of such X-rays can cause defects in both the $SiO_2$ isolating layers and the $Si-SiO_2$ interfaces. With such defects, there is a risk of modifying the electronic characteristics of the circuit components or elements in the course of time, more particularly, when elementary components, such as, for instance, field effect transistors are involved, these defects, therefore, are possible factors in the reduction of the chip reliability, which, of course, is not acceptable.

In spite of this technical prejudice resulting logically from this undesirable X-ray phenomenon, the applicant made a plurality of experimentations which showed that this phenomenon was theoretical and, indeed, in practice, had no incidence upon the unipolar products; in addition, the conventional equipment for vacuum-deposition by means of an electron gun was inoperative in the deposition of such solder pads.

The applicant, in carrying out these experimentations, made the following modifications and adaptations.

A V-shaped tantalum liner 18 has been placed inside a recess of a water-cooled copper pot or hearth 19 in a way such that there is a narrow space or gap between the liner and the pot (hearth). The liner rests or is supported upon the hearth by means of a copper ring or flange 20. The tantalum has been chosen after testing of various materials. Molybdenum was found to dissolve easily in tin and, after a few runs, there has been a reaction between the two metals which impeded any further evaporation.

With a carbon liner, tin did not wet the walls and escaped from the area upon which the beam impinged, and, therefore, had not been able to evaporate. It has been shown first, that, with a tantalum liner, the results were satisfactory more especially because tantalum did not dissolve easily in tin.

As to the particular shape of the liner, it has been observed that when the latter was V-shaped, the source could be entirely evaporated whereas, with the conventional crucible, only a small part of the source could be evaporated. The complete evaporation of the source in the crucible eliminates the necessary step of refilling the crucible. Furthermore, this crucible refilling step requires frequent displacements of the crucible which has, an effect of changing the focusing area of the beam, thereby entailing a low reproducibility of the evaporation rates.

In general, the liner or cup 18 will be configured in a bent-cone configuration, comprised of an upper tapered section extending inwardly from the lip of the cup at an angle with the vertical. This first tapered section merges with a second conical section which extends inwardly to the bottom of the cup and forms a second angle to the vertical which is greater than the angle of the cup's first tapered section. With the exception of the cup's supporting flange 20, its walls, of its two tapered sections, will be seated in spaced relationship within a like configured recess in the hearth 19.

The volume of the liner 18 is, typically, 200 cm³. The load to be evaporated will be about 2 kg of the chosen material, such as, for instance, 95 Pb-5 Sn (wt %) solder in the form of 15 or 16.5 g buttons. The space is created by the liner since it does not rest directly upon the copper pot, is profitable, is advantageous and is formed by the copper ring or radial flange which, while elevating the liner, limits the thermal exchanges and significantly improves the reproducibility of the deposits.

Focusing the electron beams showed to be also a critical point. It has been demonstrated that a nonuniform distribution of the energy over the source surface, induced random variations in the vapor pressures at various points of the melt surface, thereby entailing large variations in the evaporation rates. Various tests showed that a relatively thin electron beam (so that the impact surface is about 2 cm² and focused at the center of the source), gave the best results.

The E-beam gun is power-supplied with a 6 kW energy supply. In addition, the beam's aperture is adjusted so as to limit the parasital redepositions on the isolators, either directly through evaporation or through ion deflection because of the magnetic fields created by the gun deflection control coils.

The ion collector gauge 12 is a conventional device which, operating on the principle that the evaporated ions are ionised upon the action of the electrical fields, collects the emission of secondary electrons. Its function consists in regulating the evaporation rate and, therefore, the thickness of the deposit by monitoring the energy of the electron gun. Also the current obtained at the output is proportional to the deposition rate.

In this equipment, the gauge is used in an original way, i.e., not to regulate the evaporation rate and, therefore, control the thickness of the deposit, but instead, to detect the transition point between lead to tin evaporation. As a matter of fact, the pressure of the lead vapor is greatly lower than that of the tin vapor and, therefore, lead is evaporated first. (The same holds true with indium).

Figure 2:
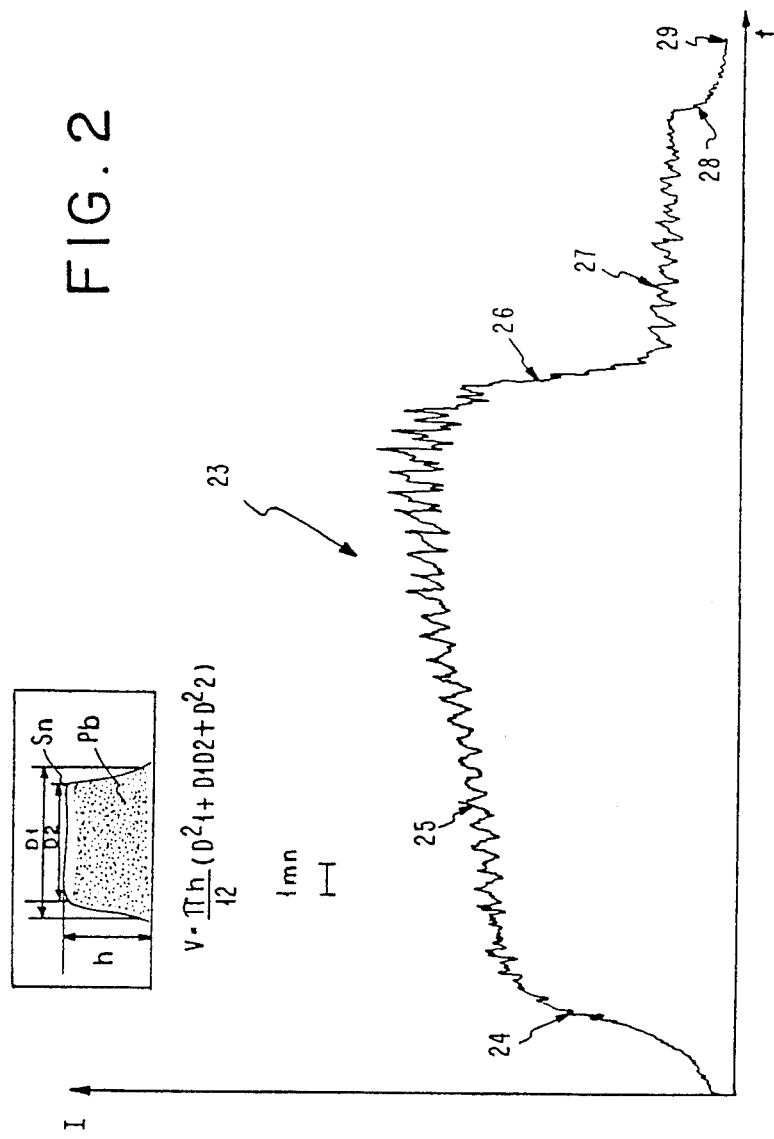
FIG. 2, illustrates the ion collector gauge output current showing the transition or change from Pb to Sn evaporation in a dual source systems such as shown in the aforesaid U.S. Pat. No. 3,576,670 and the IBM-TDB Dahlke article of October 1977.

FIG. 2, which will be discussed in more detail below, illustrates the device current output which shows that there are two transitions, making it possible to follow and monitor the process evolution.

In the frame, there are shown the respective thicknesses of the deposited lead and tin and the final volume of the pad, so that after the solder heating step, the pad has the required composition (95 Pb-5 Sn, for instance) and volume.

Finally, in order to achieve a highly efficient system as described above, the above-mentioned conventional flat and fixed wafer support which the wafer carrier 16 is usually formed of, has been replaced by a four-tier mobile dome the total capacity of which can reach, say, 52 wafers having an 82 mm diameter. Because the distances separating each of the tiers from the source, are different, which would cause the depositions of different thicknesses, a removable shield 21 is preferably associated with the dome, the function of which will be explained further on.

The so-called distribution shield which assumes the shape of part of an ellipse, is positioned between the source and the substrates so as to compensate for the directivity of the evaporation cone. When not using such a shield, the source material would be deposited in larger quantities on the higher tier wafers than on the lower tiers.

It has been observed that such a shield could play an important part in order to obtain pads of constant compositions when proceeding as follows: the shield is used during all the lead evaporation and is removed for the immediately succeeding tin evaporation.

Such a distribution shield 21 should be distinguished from the source shutter 22 which is of conventional use during the preheating step.

Such an operation is carried out automatically from indications given by the ion collector gauge. FIG. 2 illustrates the progression of the output current of ion collector gauge 17 of FIG. 1 in terms of the deposition time length.

Curve 23 includes a first increasing portion 24, which is a characteristic of when the preheating step of the evaporating unit starts. Portion 25 starts at the end of the preheating step, and is practically a constant current portion, and is a measurement of the time length of the lead deposition. Portion 26 corresponds to the time when lead stops being evaporated and is the transition from lead to tin evaporation. Portion 27 is the measurement of the time length of the tin evaporation. Another portion 28 indicates when tin stops being evaporated and portion 29 indicates when the evaporating unit stops operating. Shield 21 will, therefore, be removed when transition 26 is detected by gauge 17 whereas the evaporation process will stop when transition 28 is detected. In this way, dispersions in the alloy compositions 95 Pb-5 Sn have been considerably reduced, as shown in FIG. 3.

Figure 3:
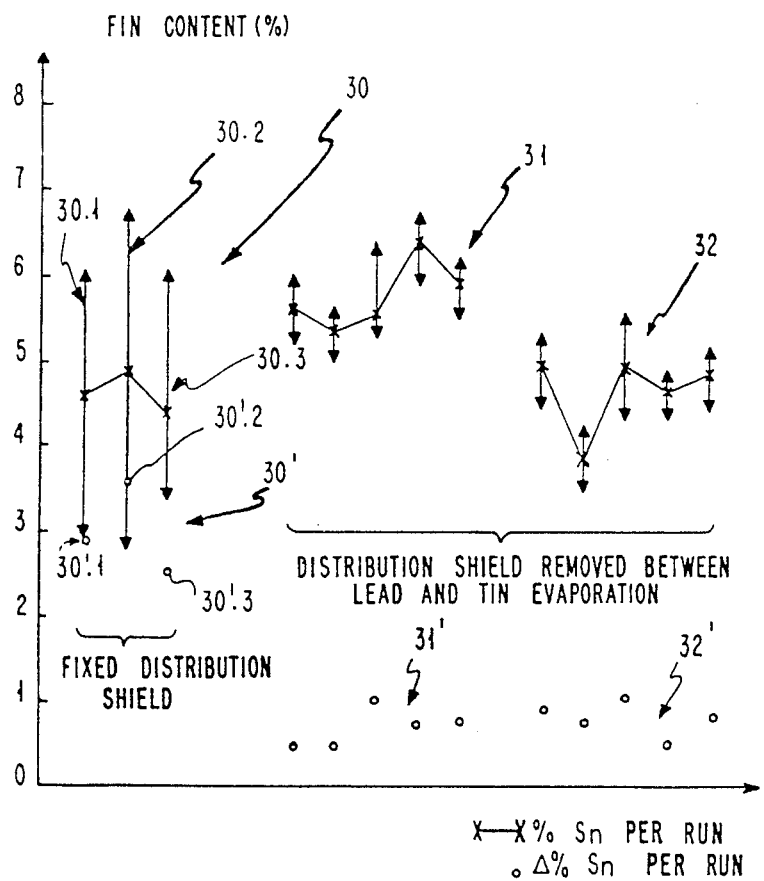
FIG. 3, illustrates the composition dispersions obtained in the deposited films, as the distribution shield in the vacuum chamber is fixed or removed to differentiate lead evaporation from tin evaporation.

FIG. 3 illustrates the variations in tin content as shield 21 is used throughout the evaporation process or removed at the transition from lead to tin evaporation. Curves 30 show the variations, over three runs (30.1 through 30.3), in the tin content when the shield 21 is used throughout the evaporation process, showing the corresponding differential variations between the minima and the maxima. Curve 30.1 shows that the tin content varies from 3% (min. value) to 6% (max. value). It can be observed that, in this case, the differential variations are about 3%. When the shield is removed according to this invention (curves 31 and 32) it can be observed that the variations are only in the order of 0.5%–1% (points 31' and 32').

This process can be summarized as follows: The pressure at the beginning of the run is about $2.5 \times 10^{-3}$ Torr P(absolute), which will be reached within 15 min, at most. The vacuum limit will be $1.3 \times 10^{-5}$ Pa and the maximum hydrocarbon range will be 5 V %. The source or bulk will be the previously mentioned mass of about 2 kg of 95 Pb-5 Sn, solder in the form of 15 g buttons, for instance. The gun power-supply will be 6 kW, and the beam focusing will be at the center of the source area, the impact area being about 2 cm². The dome is of the tier type and has about 52 wafers 82 mm dia, at the emplacements designated by W. A 6 tr(turns)/minute±3 tr/minute rotation of the dome will be carried out over the deposition time. The source will be centered with respect to the dome rotation axis. The distances from the source center to each of the wafer centers, are:

58.4 cm for the lower tiers (No. 1)
62.0 cm for the lower tiers (No. 2)
67.3 cm for the lower tiers (No. 3)
68.8 cm for the higher tiers (No. 4)

The crucible walls will be protected with stainless steel liners which are cooled during the run and heated during ventilating and airing of the crucible. Vacuum is interrupted by nitrogen.

The dome is rotated and the electron gun is power-supplied as soon as $2.5 \times 10^{-3}$ torr Pa vacuum is obtained.

The bulk or source is pre-heated about 10 mn. Such a step is intended to make the source liquid so as to remove the gas therefrom. During the pre-heating step, source shutter 22 is used. At the end of this pre-heating step, this shutter 22 is removed and shield 21 is automatically fixed all the time lead is being evaporated; this shield is fixed about 200 mm from the source plane. The end of lead evaporation is detected by transition 26 of the signal produced by the gauge. Then, the shield is automatically removed and tin evaporation takes place. Once the evaporation step is over, pumping is operated 5 mm and, then, nitrogen is ventilated 15 mn. The high potential of the gun is interrupted and the dome rotation is stopped during this nitrogen ventilation.

The run time length is about 105 mms for Pb-Sn deposition. The following values relative to the thickness variations, have been observed:

one run tolerance
114±7 μm run-to-run tolerance
114±10 μm

The lifetimes of the crucibles are about 30 runs.

The advantages resulting from the implementation of the equipment according to this invention with respect to the use of the conventional RF induction vacuum-deposition equipment, are as follows:

a higher yield, i.e., the percentage of the chips to be discarded is lowered from 0.4% to 0.2%.

a higher yield capacity because the run time lengths are lowered by 30% (about 105 mn instead of about 140 mn); a total automation is possible.

a substantial cost saving: the crucible lifetime is multiplied by three and, besides the removal of a R.F. induction generator, there is a non negligible space saving.

It appears from the foregoing that the vacuum deposition of solder pads by an electron gun is a technique which will be of wide use in the future because it considerably reduces both the above coupling problems and spitting phenomena. As to the spitting phenomenon, the oxidized compounds storing the negative charges by trapping electrons from the beam are repelled from the beam impact point, and therefore, from the melt surface.

We claim:

1. An Electron beam system for vacuum metal deposition from a melt thereof comprised of a vacuum chamber having disposed therein a substrate carrier for supporting a plurality of substrates, and an inert open crucible disposed below said carrier and containing a source of the material to be evaporated, and means for melting and evaporation of said source comprised of an electron-beam gun in said chamber generating a beam of electrons focused to directly impinge on said source, a copper hearth in said chamber having a recess for seating said crucible therein; said crucible having a bent-cone configuration comprising a first tapered section extending inwardly from the lip of said crucible and forming a first angle with the vertical, said first section merging with a second conical section tapering inwardly to a point at the bottom of said cup and forming a second angle with the vertical greater than said first angle; and wherein said recess has a configuration corresponding to the configuration of said crucible for nesting thereof in spaced relationship to each other, with said crucible supported in said recess at said lip by a radially extending flange therefrom and supported on the top surface of said hearth.

2. The Electron gun unit of claim 1, wherein said electron beam is focused on to a small area at the center of the source.

3. The Electron gun unit of claim 2 wherein said substrates are silicon wafers masked according to a desired configuration so as to expose the emplacements intended to receive deposition of the evaporated material.

4. The Electron gun unit of claim 3, wherein said crucible is formed of tantalum.

5. The Electron gun unit of claim 4, wherein said material is a solder alloy selected from a group consisting of Pb-Sn and Pb-In alloys.

6. The electron gun unit of claim 5, including, an ion collector gauge with the output current thereof indicative of the length of the lead deposition time, and then of the length of the transition time from lead evaporation to evaporation of the second component of said alloy and of the time length of evaporation of said second component of said alloy.

7. The Electron gun unit of claim 6, wherein said carrier which carries the silicon wafers is formed of a rotatively mobile dome comprised of several wafer supporting tiers.

8. The Electron gun unit of claim 7, including, a removable shield having an elliptical shape and disposed between the source and the wafers during lead evaporation of said alloy and which is removed during the evaporation of said second component of a said alloy, its motion being controlled by the transition monitored by the ion collector gauge.

* * * * *